(12) United States Patent
Arai et al.

(10) Patent No.: US 7,382,653 B2
(45) Date of Patent: Jun. 3, 2008

(54) ELECTRICALLY REWRITABLE NON-VOLATILE SEMICONDUCTOR MEMORY DEVICE

(75) Inventors: Fumitaka Arai, Yokohama (JP); Masayuki Ichige, Yokkaichi (JP)

(73) Assignee: Kabsuhiki Kaisha Toshiba, Tokyo (JP)

( * ) Notice: Subject to any disclaimer, the term of this patent is extended or adjusted under 35 U.S.C. 154(b) by 16 days.

(21) Appl. No.: 11/566,283

(22) Filed: Dec. 4, 2006

(65) Prior Publication Data

US 2007/0147122 A1 Jun. 28, 2007

(30) Foreign Application Priority Data

Dec. 27, 2005 (JP) .............................. 2005-376296

(51) Int. Cl.
*G11C 11/34* (2006.01)
(52) U.S. Cl. ............................ 365/185.17; 365/185.18; 365/185.23
(58) Field of Classification Search ........... 365/185.17, 365/185.18, 185.19, 185.23, 185.24
See application file for complete search history.

(56) References Cited

U.S. PATENT DOCUMENTS

| 6,363,013 | B1 * | 3/2002 | Lu et al. ................. 365/185.18 |
| 7,071,511 | B2 | 7/2006 | Sakuma et al. |
| 7,227,781 | B2 * | 6/2007 | Iizuka .................... 365/185.17 |
| 7,233,522 | B2 * | 6/2007 | Chen et al. ............. 365/185.02 |
| 2005/0056869 | A1 | 3/2005 | Ichige et al. |
| 2005/0073001 | A1 | 4/2005 | Kamigaichi et al. |
| 2005/0237824 | A1 * | 10/2005 | Umezawa et al. ...... 365/189.11 |
| 2006/0023505 | A1 * | 2/2006 | Iizuka .................... 365/185.05 |
| 2006/0186464 | A1 | 8/2006 | Sakuma et al. |
| 2007/0036000 | A1 * | 2/2007 | Kutsukake et al. .... 365/185.17 |

FOREIGN PATENT DOCUMENTS

JP          9-82922        3/1997

* cited by examiner

*Primary Examiner*—Anh Phung
*Assistant Examiner*—Hien Nguyen
(74) *Attorney, Agent, or Firm*—Oblon, Spivak, McClelland, Maier & Neustadt, P.C.

(57) ABSTRACT

A first selection transistor is connected between one end of a memory cell group and a bit line. A second selection transistor which has a gate length shorter than a gate length of the first transistor is connected between the other end of the memory cell group and a source line. In a write, a control gate driver applies a write voltage to the control gate of the memory cell as a write target, and applies an intermediate voltage to the control gates of the other memory cells. A selection gate driver supplies a first voltage lower than the intermediate voltage to the first transistor, and supplies a second voltage lower than the first voltage to the second transistor. A bit line controller supplies the first voltage to the bit line which is not selected for writing, and a source line driver supplies the first voltage to the source line.

19 Claims, 5 Drawing Sheets

ELECTRICALLY REWRITABLE NON-VOLATILE SEMICONDUCTOR MEMORY DEVICE

CROSS-REFERENCE TO RELATED APPLICATIONS

This application is based upon and claims the benefit of priority from prior Japanese Patent Application No. 2005-376296, filed Dec. 27, 2005, the entire contents of which are incorporated herein by reference.

BACKGROUND OF THE INVENTION

1. Field of the Invention

The present invention relates to a non-volatile semiconductor memory device, and relates to, e.g., an electrically rewritable NAND type EEPROM (electrically erasable and programmable ROM) provided with memory cells each having a control gate and a floating gate.

2. Description of the Related Art

In recent years, as an electrically rewritable non-volatile semiconductor memory device, an NAND type EEPROM has been known. The NAND type EEPROM is characterized in that selection gate transistors arranged at both ends of a plurality of memory cells (which will be referred to as NAND cells hereinafter) connected in series determine selection and non-selection of each NAND cell.

When selection of each NAND cell is performed by using the selection gate transistors, each memory cell does not have to have a signal ratio in a selective state or a non-selective state. This is an influential factor which advances miniaturization of each memory cell in the NAND type EEPROM but, on the other hand, miniaturization of the selection gate transistor has not been greatly advanced.

It is to be noted that an NAND type EEPROM provided with a program control circuit which controls a voltage supplied to each gate of NAND cells and selection gate transistors has been disclosed as a prior art concerning the present invention (see, e.g., Jpn. Pat. Appln. KOKAI Publication No. 9-82922). However, the selection gate transistors cannot be miniaturized even in this NAND type EEPROM.

BRIEF SUMMARY OF THE INVENTION

According to a first aspect of the present invention, there is provided a non-volatile semiconductor memory device comprising: a memory cell group in which a plurality of memory cells each having a control gate and a floating gate are connected in series; a first selection gate transistor connected between one end of the memory cell group and a bit line; a second selection gate transistor which is connected between the other end of the memory cell group and a source line and has a gate length shorter than a gate length of the first selection gate transistor; a control gate drive circuit which drives the control gates of the memory cell group; a selection gate drive circuit which drives gates of the first and second selection gate transistors; a source line drive circuit which drives the source line; and a bit line control circuit which supplies a bit line potential which is used to select data which should be written in the memory cells through the bit line, wherein, at the time of a write operation, the control gate drive circuit applies a write voltage to the control gate of the memory cell which is a write target in the memory cell group and applies an intermediate voltage lower than the write voltage to the control gates of the other memory cells, the selection gate drive circuit supplies a first voltage lower than the intermediate voltage to the gate of the first selection gate transistor and supplies a second voltage lower than the first voltage to the gate of the second selection gate transistor, the bit line control circuit supplies the first voltage to the bit line which is not selected for writing, and the source line drive circuit supplies the first voltage to the source line.

According to a second aspect of the present invention, there is provided a non-volatile semiconductor memory device comprising: a memory cell group in which a plurality of memory cells each having a control gate and a floating gate are connected in series; a first selection gate transistor connected between one end of the memory cell group and a bit line; a second selection gate transistor which is connected between the other end of the memory cell group and a source line and has a gate length shorter than a gate length of the first selection gate transistor; a control gate drive circuit which drives the control gates of the memory cell group; a selection gate drive circuit which drives gates of the first and second selection gate transistors; a source line drive circuit which drives the source line; and a bit line control circuit which supplies a bit line potential which is used to select data to be written in the memory cells through the bit line, wherein, at the time of a write operation, the control gate drive circuit applies a predetermined voltage to the control gate of the memory cell adjacent to the second selection gate transistor in the memory cell group, applies a write voltage higher than the predetermined voltage to the control gate of the memory cell as a write target and applies an intermediate voltage which is higher than the predetermined voltage and lower than the write voltage to control gates of the other memory cells, the selection gate drive circuit supplies a first voltage lower than the intermediate voltage to the gate of the first selection gate transistor and supplies a second voltage lower than the first voltage to the gate of the second selection gate transistor, the bit line control circuit supplies the first voltage to the bit line which is not selected for writing, and the source line drive circuit supplies the first voltage to the source line.

According to a third aspect of the present invention, there is provided a non-volatile semiconductor memory device comprising: a memory cell group in which a plurality of memory cells each having a control gate and a floating gate are connected in series; a first selection gate transistor connected between one end of the memory cell group and a bit line; a second selection gate transistor which is connected between the other end of the memory cell group and a source line and has a gate length shorter than a gate length of the first selection gate transistor; a control gate drive circuit which drives the control gates of the memory cell group; a selection gate drive circuit which drives gates of the first and second selection gate transistors; a source line drive circuit which drive the source line; and a bit line control circuit which supplies a bit line potential which is used to select data to be written in the memory cells through the bit line, wherein, at the time of a write operation, the control gate drive circuit applies a write voltage to the control gate of the memory cell as a write target which is adjacent to the second selection gate transistor in the memory cell group and applies an intermediate voltage lower than the write voltage to the control gates of the other memory cells, the selection gate drive circuit supplies a first voltage lower than the intermediate voltage to the gate of the first selection gate transistor and supplies a second voltage lower than the first voltage to the gate of the second selection gate transistor, the bit line control circuit supplies the first voltage to the bit line which is not selected for writing, and the source line drive circuit supplies a predetermined voltage higher than the first voltage to the source line.

According to a fourth aspect of the present invention, there is provided a non-volatile semiconductor memory device comprising: a memory cell array in which memory cell units are arranged in a matrix form, the memory cell unit each including a memory cell group, a first selection gate transistor and a second selection gate transistor, the memory cell group including a plurality of memory cells each having a control gate and a floating gate superimposed therein are connected in series in such a manner that a source or a drain is shared by the memory cells adjacent to each other, the first selection gate transistor being connected between one end of the memory cell group and a bit line, the second selection gate transistor being connected between the other end of the memory cell group and a source line, the second selection gate transistor having a gate length shorter than a gate length of the first selection gate transistor; a control gate drive circuit which drives the control gates of the memory cell groups in the memory cell unit; a selection gate drive circuit which drives gates of the first and second gate transistors in the memory cell unit; a source line drive circuit which drives the source line; and a bit line control circuit which writes data in the memory cells through the bit line.

DETAILED DESCRIPTION OF THE INVENTION

Figure 1:
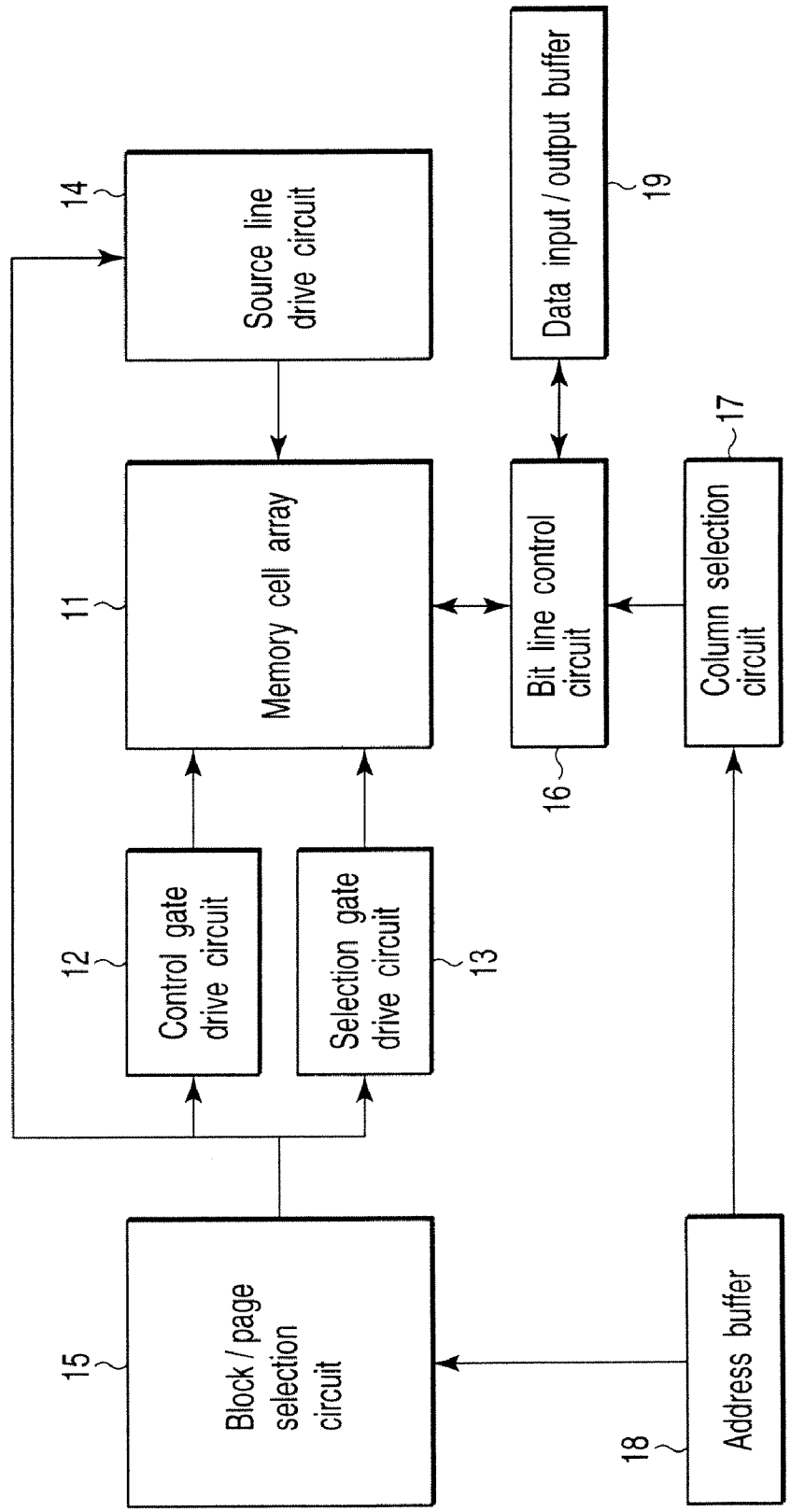
FIG. 1 is a block diagram showing a configuration of an NAND type EEPROM according to a first embodiment of the present invention.

A non-volatile semiconductor memory device according to each embodiment of the present invention will now be described hereinafter with reference to the accompanying drawings. For a description, like reference numerals denote like parts throughout the drawings.

First Embodiment

An NAND type EEPROM according to a first embodiment of the present invention will first be described.

FIG. 1 is a block diagram showing a configuration of the NAND type EEPROM according to the first embodiment.

This NAND type EEPROM is provided with a memory cell array 11, a control gate drive circuit 12, a selection gate drive circuit 13, a source line drive circuit 14, a block-and-page selection circuit 15, a bit line control circuit 16, a column selection circuit 17, an address buffer 18, and a data input/output buffer 19.

An address signal stored in the address buffer 18 is transmitted to the block-and-page selection circuit 15 and the column selection circuit 17. The block-and-page selection circuit 15 and the column selection circuit 17 use the control gate drive circuit 12, the selection gate drive circuit 13, the source line drive circuit 14 and the bit line control circuit 16 to select a memory cell in the memory cell array 11 based on the address signal. Write data is transferred to the bit line control circuit 16 through the data input/output buffer 19, and written in the selected memory cell. In other words, the bit line control circuit 16 supplies a bit line potential which is used to select data to be written to the memory cell through the bit line. Further, the bit line control circuit 16 outputs through the data input/output buffer 19 data read from the memory cell in the memory cell array 11.

The memory cell array 11 is divided into a plurality of blocks, and each block includes a plurality of pages. Each page consists of a plurality of memory cells which share a control gate (a word line). In other words, the plurality of pages constitute the block, and the plurality of blocks constitute the memory cell array 11. Usually, erasing is performed in units of blocks, and writing and reading are carried out in units of pages. The memory cell has a control gate and a floating gate, and an NAND cell unit is constituted of a memory cell group (which will be referred to as an NAND cell hereinafter) in which the plurality of memory cells are connected in series and selection gate transistors connected at both ends of the NAND cell. Moreover, a source line is connected with one selection gate transistor, and a bit line is connected with the other selection gate transistor.

The address buffer 18 stores an externally input address signal, and outputs it to the block-and-page selection circuit 15 and the column selection circuit 17. The block-and-page selection circuit 15 outputs a row selection signal which is used to select a block and a page (e.g., a control gate, a selection gate and a source line) in the memory cell array 11 based on the address signal to the control gate drive circuit 12, the selection gate drive circuit 13 and the source line drive circuit 14. The control gate drive circuit 12 drives the control gates of the memory cells based on the row selection signal. The selection gate drive circuit 13 drives the selection gate which is a gate of the selection gate transistor based on the row selection signal, and turns on or off the selection gate transistor. Additionally, the source line drive circuit 14 drives the source line connected with one selection gate transistor.

The column selection circuit 17 outputs a column selection signal which is used to select a bit line in a column direction in the memory cell array 11 based on the address signal to the bit line control circuit 16. The bit line control circuit 16 drives the bit line connected with the other selection gate transistor based on the column selection signal. In other words, the bit line control circuit 16 writes write data received from the data input/output buffer 19 in the selected memory cell. The bit line control circuit 16 outputs data read from the memory cell to the data input/output buffer 19.

Figure 2:
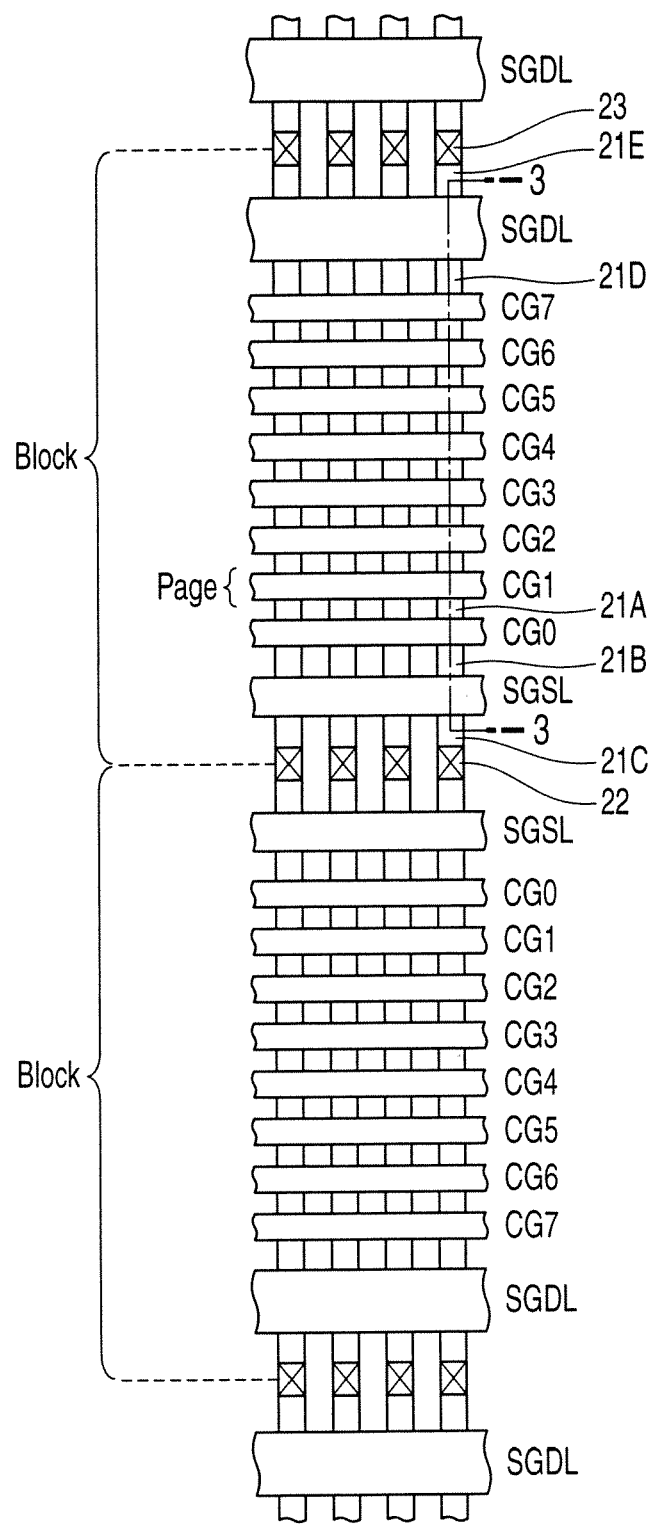
FIG. 2 is a view showing an arrangement of control gates of memory cells in a memory cell array and selection gates of selection gate transistors according to the first embodiment.

FIG. 2 is a view showing an arrangement of control gates (word lines) CG0 to CG7 of memory cells M0 to M7 and selection gates SGSL and SGDL of selection gate transistors SGS and SGD in the NAND cell unit in the memory cell array 11. In this drawing, floating gates are eliminated.

The control gates CG0 to CG7 of the memory cells M0 to M7 are arranged in parallel with a diffusion layer (a source or a drain) 21A therebetween. The selection gate SGSL of the selection gate transistor SGS is arranged next to the control gate CG0 with a diffusion layer (a source or a drain) 21B therebetween, and a source contact 22 which connects the other diffusion layer (a source or a drain) 21C of the selection gate transistor SGS with a source line is formed on the diffusion layer 21C. Further, the selection gate SGDL of the selection gate transistor SGD is arranged next to the control gate CG7 with a diffusion layer (a source or a drain) 21D therebetween, and a drain contact 23 which connects the other diffusion layer (a source or a drain) 21E of the selection gate transistor SGD with the bit line is formed on the diffusion layer 21E. As shown in FIG. 2, a width (a gate length) of the selection gate SGSL of the selection gate transistor SGS is shorter than a width (a gate length) of the selection gate SGDL of the selection gate transistor SGD.

Figure 3:
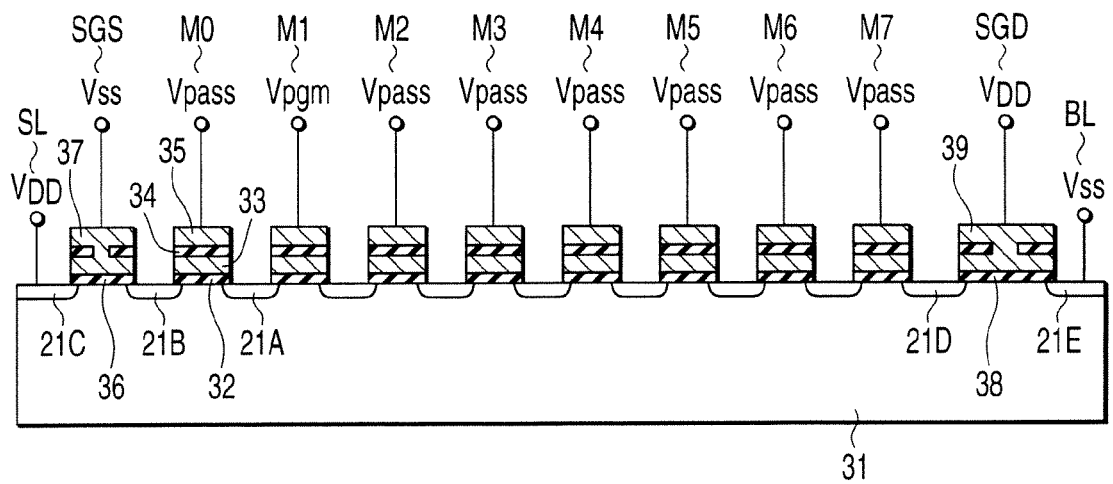
FIG. 3 is a cross-sectional view taken along a line 3-3 in FIG. 2 and is also a view showing a voltage applied state at the time of a write operation in the first embodiment.

FIG. 3 is a cross-sectional view taken along a line 3-3 in FIG. 2, and shows a cross section of the NAND cell and the selection gate transistor.

The memory cells M0 to M7 are connected in series in such a manner that the diffusion layer 21A formed in a surface region of a semiconductor substrate 31 is shared by memory cells adjacent to each other, thereby constituting the NAND cell. The selection gate transistor SGS is arranged between one end of the NAND cell and the source line SL, and the selection gate transistor SGS controls connection between the NAND cell and the source line SL. The selection gate transistor SGD is arranged between the other end of the NAND cell and the bit line BL, and the selection gate transistor SGD controls connection between the NAND cell and the bit line BL.

Furthermore, the memory cells have the following structure. The diffusion layers 21A or the diffusion layers 21B and 21D are formed apart from each other in the surface region of the semiconductor substrate 31. A floating gate 33 is formed on the semiconductor substrate 31 through a gate insulating film 32 between the diffusion layers 21A, between the diffusion layer 21A and the diffusion layer 21B and between the diffusion layer 21A and the diffusion layer 21D. A control gate 35 is formed on each floating gate 33 through an inter-gate insulating film 34. Moreover, the selection gate transistor SGS has the following structure. The diffusion layers 21B and 21C are formed apart from each other in the surface region of the semiconductor substrate 31. A selection gate 37 is formed on the semiconductor substrate 31 through a gate insulating film 36 between the diffusion layer 21B and the diffusion layer 21C. Additionally, the selection gate transistor SGD has the following structure. The diffusion layers 21D and 21E are formed apart from each other in the surface region of the semiconductor substrate 31. A selection gate 39 is formed on the semiconductor substrate 31 through a gate insulating film 38 between the diffusion layer 21D and the diffusion layer 21E.

A write operation in the NAND type EEPROM according to the first embodiment will now be described with reference to FIGS. 3 and 4. Here, it is assumed that data is written in the memory cell M1 having the control gate CG1. FIG. 3 shows a voltage applied state when writing "0" in the memory cell M1, and FIG. 4 shows a writing inhibited state after the state depicted in FIG. 3.

First, as shown in FIG. 3, a write voltage Vpgm (e.g., approximately 20 V) is applied to the control gate CG1 of the memory cell M1 as a write target, and an intermediate voltage Vpass (e.g., approximately 10 V) is applied to the control gates CG0 and CG2 to CG7 of the other memory cells M0 and M2 to M7. Additionally, a reference voltage Vss (e.g., a ground potential (approximately 0 V)) is applied to the selection gate of the selection gate transistor SGS, and an internal power supply voltage VDD (e.g., approximately 1.5 V to 2.5 V) is applied to source line SL. Further, the internal power supply voltage VDD is applied to the selection gate of the selection gate transistor SGD, and the reference voltage Vss is applied to the bit line BL. As a result, electrons are injected into the floating gate of the memory cell M1, and "0" is thereby written. It is to be noted that although the ground potential (approximately 0 V) is applied to the selection gate of the selection gate transistor SGS in the above-described example, a voltage of approximately 0.3 to 0.7 V (e.g., 0.5 V) may be applied to the selection gate of the selection gate transistor SGS in order to alleviate an electric field between the drain and the selection gate of the selection gate transistor SGS to suppress occurrence of hot carriers. Furthermore, the internal power supply voltage VDD is obtained by stabilizing an external power supply voltage Vcc (e.g., 3.3 V) supplied from the outside into an appropriate voltage in the NAND type EEPROM.

Figure 4:
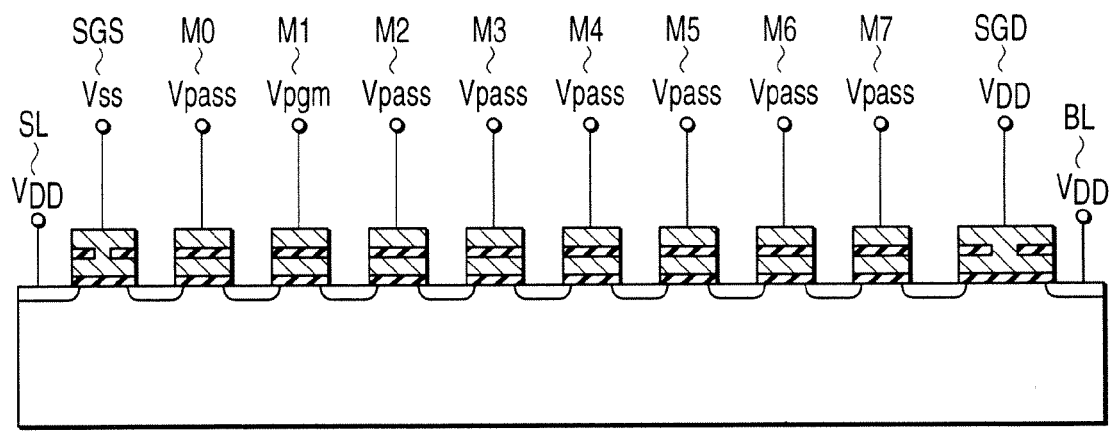
FIG. 4 is a view showing a voltage applied state when the write operation is inhibited in the first embodiment.

Then, as shown in FIG. 4, the voltage alone applied to the bit line BL is changed from the reference voltage Vss to the internal power supply voltage VDD. As a result, the selection gate transistor SGD is cut off, and a channel potential is increased to approximately 8 V by coupling. In this manner, the memory cell M1 shown in FIG. 4 enters the writing inhibited state.

Figure 5:
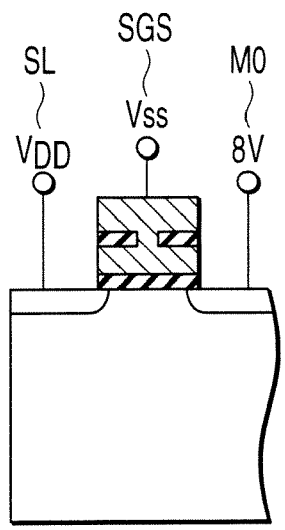
FIG. 5 is a view showing a voltage applied to a selection gate transistor SGS in the voltage applied state depicted in FIG. 4.
Figure 6:
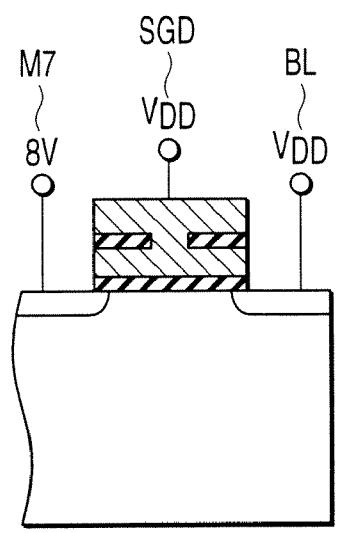
FIG. 6 is a view showing a voltage applied to a selection gate transistor SGD in the voltage applied state depicted in FIG. 4.

At this time, the voltages applied to the gate, the source and the drain of the selection gate transistor SGS become as shown in FIG. 5, and the voltages applied to the gate, the source and the drain of the selection gate transistor SGD become as shown in FIG. 6. Both these selection gate transistors are cut off, both the voltages applied to the drains are approximately 8 V, and both the voltages applied to the sources are the internal power supply voltage VDD (e.g., approximately 1.5 V to 2.5 V). However, the internal power supply voltage VDD is applied to the gate of the selection gate transistor SGD, and the reference voltage Vss (e.g., approximately 0 V) is applied to the gate of the selection gate transistor SGS. Therefore, a gate length required for the selection gate transistor SGS to be cut off can be shorter than a gate length required for the selection gate transistor SGD to be cut off. That is, in the voltage applied state shown in FIGS. 5 and 6, it is good enough for each of the selection gate transistors to have a gate length required to prevent punch-through from occurring. Since the selection gate voltage of the selection gate transistor SGS is lower than the selection gate voltage of the selection gate transistor SGD, the gate length (a width of the selection gate) of the selection gate transistor SGS can be set shorter than the gate length (a width of the selection gate) of the selection gate transistor SGD. As a result, the selection gate transistor connected between the NAND cell and the source line SL can be miniaturized. Moreover, it is possible to advance miniaturization of the NAND type EEPROM including the selection gate transistors at both ends of the NAND cell. cl Second Embodiment An NAND type EEPROM according to a second embodiment of the present invention will now be described. Like reference numerals denote parts equal to the structures in the first embodiment, thereby eliminating their explanation.

A write operation in the NAND type EEPROM according to the second embodiment will be described with reference to FIG. 7. Here, it is assumed that data is written in a memory cell M1 having a control gate CG1.

Figure 7:
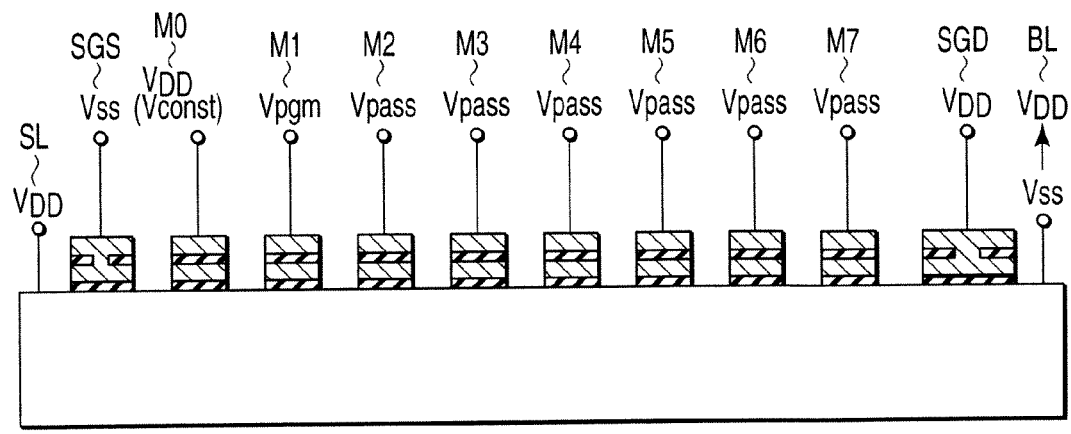
FIG. 7 is a view showing a voltage applied state at the time of a write operation in a second embodiment of the present invention.

FIG. 7 is a view showing a voltage applied state at the time of a write operation in the second embodiment. A write voltage Vpgm (e.g., approximately 20 V) is applied to the control gate CG1 of the memory cell M1 as a write target, an internal power supply voltage VDD (e.g., approximately 1.5 V to 2.5 V) or a constant voltage Vconst (e.g., approximately 0 V to 4 V) lower than an intermediate voltage Vpass (e.g., approximately 10 V) is applied to a control gate CG0 of a memory cell M0, and the intermediate voltage Vpass is applied to control gates CG2 to CG7 of the other memory cells M2 to M7. Moreover, a reference voltage Vss (e.g., a ground potential (approximately 0 V)) is applied to a selection gate of a selection gate transistor SGS, and the internal power supply voltage VDD is applied to a source line SL. Additionally, the internal power supply voltage VDD is applied to a selection gate of a selection gate transistor SGD, and the reference voltage Vss is applied to a bit line BL. Then, the voltage applied to the bit line BL is changed from the reference voltage Vss to the internal power supply voltage VDD. As a result, electrons are injected into a floating gate of the memory cell M1, and "0" is thereby written. Then, the memory cell M1 enters a writing inhibited state. It is to be noted that the ground potential (approximately 0 V) is applied to the selection gate of the selection gate transistor SGS in the above-described example, but a voltage of approximately 0.3 to 0.7 V (e.g., 0.5 V) may be applied to the selection gate of the selection gate transistor SGS in order to alleviate an electric field between a drain and the selection gate of the selection gate transistor SGS to suppress occurrence of hot carriers.

At this time, voltages applied to the gate, the source and the drain of the selection gate transistor SGS are as follows. Both the selection gate transistors SGS and SGD are cut off, and a channel potential is increased by coupling. However, since the voltage applied to the control gate CG0 of the memory cell M0 is the internal power supply voltage VDD or the constant voltage Vconst, the channel potential is lower than that of the first embodiment and becomes a voltage lower than 8 V. Therefore, the voltage applied to the drain of the selection gate transistor SGS is a voltage lower than 8 V, and the voltages applied to the source and the gate of the same are respectively the internal power supply voltage VDD and the reference voltage Vss like the first embodiment. Any other structures are the same as those in the first embodiment.

Here, although 8 V is applied to the drain of the selection gate transistor SGS in the first embodiment, a voltage lower than 8 V is applied to the drain in this second embodiment. Therefore, a gate length required for the selection gate transistor SGS to be cut off can be shorter than that in the first embodiment. That is, in the writing inhibited state shown in FIG. 7, since the voltage applied to the drain of the selection gate transistor SGS is a voltage lower than that in the first embodiment, a gate length (a width of the selection gate) required to prevent punch-through from occurring in the selection gate transistor SGS can be set shorter than the gate length (a width of the selection gate) of the selection gate transistor SGS in the first embodiment. As a result, in the second embodiment, the selection gate transistor SGS can be further miniaturized as compared with the first embodiment. Additionally, it is possible to advance miniaturization of the NAND type EEPROM including the selection gate transistors at both ends of the NAND cell.

Third Embodiment

An NAND type EEPROM according to a third embodiment of the present invention will now be described. Like reference numerals denote parts equal to the structures in the first embodiment, thereby eliminating their detailed explanation.

A write operation in the NAND type EEPROM according to the third embodiment will be described with reference to FIG. 8. In this third embodiment, a description will be given as to a case where data is written in a memory cell M0 adjacent to a selection gate transistor SGS.

Figure 8:
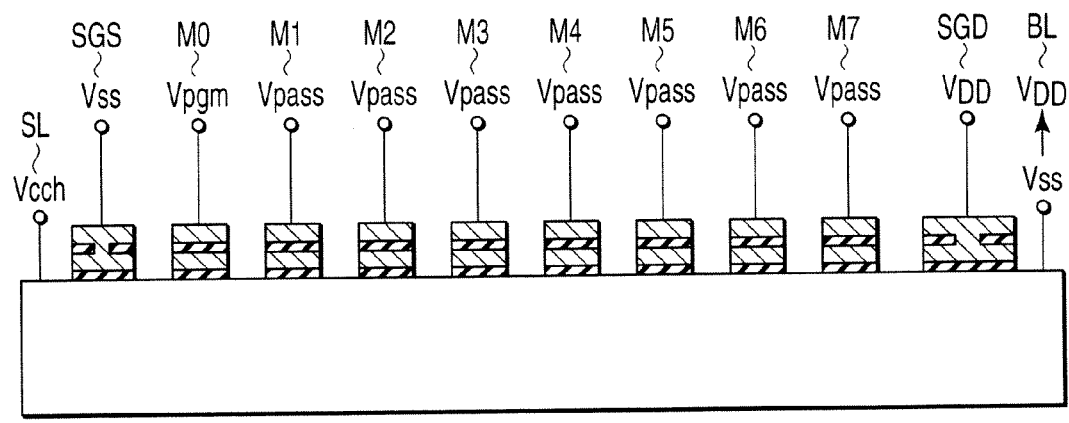
FIG. 8 is a view showing a voltage applied state at the time of a write operation in a third embodiment of the present invention.

FIG. 8 is a view showing a voltage applied state at the time of a write operation in the third embodiment. A write voltage Vpgm (e.g., approximately 20 V) is applied to a control gate CG0 of the memory cell M0 as a write target, and an intermediate voltage Vpass is applied to control gates CG1 to CG7 of the other memory cells M1 to M7. Further, a reference voltage Vss (e.g., a ground potential (approximately 0 V)) is applied to a selection gate of the selection gate transistor SGS, and a voltage Vcch (e.g., approximately Vcc+1 V) higher than an internal power supply voltage VDD is applied to a source line SL. Furthermore, the internal power supply voltage VDD is applied to a selection gate of a selection gate transistor SGD, and a reference voltage Vss is applied to a bit line BL. Then, the voltage applied to the bit line BL is changed from the reference voltage Vss to the internal power supply voltage VDD. As a result, electrons are injected into a floating gate of the memory cell M0, and "0" is thereby written. Then, the memory cell M0 enters a writing inhibited state. It is to be noted that a ground potential (approximately 0 V) is applied to the selection gate of the selection gate transistor SGS in the above-described example, but a voltage of approximately 0.3 to 0.7 V (e.g., 0.5 V) may be applied to the selection gate of the selection gate transistor SGS in order to alleviate an electric field between a drain and the selection gate of the selection gate transistor SGS to suppress occurrence of hot carriers.

At this time, the voltages applied to the gate, the source and the drain of the selection gate transistor SGS are as follows. Both the selection gate transistors SGS and SGD are cut off, and a channel potential is increased to approximately 8 V by coupling. Moreover, the voltage Vcch higher than the internal power supply voltage VDD is applied to the source of the selection gate transistor SGS. Therefore, the voltage applied to the source of the selection gate transistor SGS is the voltage Vcch higher than the internal power supply voltage VDD, and the voltages applied to the drain and the gate of the same are respectively the channel potential 8 V and the reference voltage Vss like the first embodiment. Any other configurations are the same as those in the first embodiment.

Here, although the internal power supply voltage VDD is applied to the source of the selection gate transistor SGS in the first embodiment, the voltage Vcch higher than the internal power supply voltage VDD is applied to the source in this third embodiment. Therefore, a gate length required for the selection gate transistor SGS to be cut off can be shorter than that in the first embodiment. That is, in the writing inhibited state shown in FIG. 8, since the voltage applied to the source of the selection gate transistor SGS is a voltage higher than that in the first embodiment, a gate length (a width of the selection gate) required to prevent punch-through from occurring in the selection gate transistor SGS can be set shorter than a gate length (a width of the selection gate) of the selection gate transistor SGS in the first embodiment. As a result, in the third embodiment, the selection gate transistor SGS can be more miniaturized as compared with the first embodiment. Additionally, it is possible to advance miniaturization of the NAND type EEPROM including the selection gate transistors at both ends of the NAND cell. It is to be noted that the description has been given as to the fact that the gate length of the selection gate transistor SGS can be set shorter than the gate length of the selection gate transistor SGD in the third embodiment, but it is possible to obtain an effect of suppressing punch-through from occurring in the selection gate transistor SGS even if these gate lengths are substantially equal to each other.

According to the embodiments of the present invention, it is possible to provide the non-volatile semiconductor memory device in which the selection gate transistors which determine selection or non-selection of the plurality of memory cells connected in series can be miniaturized.

Further, not only each of the foregoing embodiments can be solely carried out, but also these embodiments can be appropriately combined with each other to be carried out. Furthermore, inventions on various stages are included in the foregoing embodiments, and the inventions on various stages can be extracted by appropriately combining a plurality of structural requirements disclosed in the foregoing embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A non-volatile semiconductor memory device comprising:
   a memory cell group in which a plurality of memory cells each having a control gate and a floating gate are connected in series;
   a first selection gate transistor connected between one end of the memory cell group and a bit line;
   a second selection gate transistor which is connected between the other end of the memory cell group and a source line and has a gate length shorter than a gate length of the first selection gate transistor;
   a control gate drive circuit which drives the control gates of the memory cell group;
   a selection gate drive circuit which drives gates of the first and second selection gate transistors;
   a source line drive circuit which drives the source line; and
   a bit line control circuit which supplies a bit line potential which is used to select data to be written in the memory cells through the bit line,
   wherein, at the time of a write operation, the control gate drive circuit applies a write voltage to the control gate of the memory cell as a write target in the memory cell group, and applies an intermediate voltage lower than the write voltage to the control gates of the other memory cells,
   the selection gate drive circuit supplies a first voltage lower than the intermediate voltage to the gate of the first selection gate transistor, and supplies a second voltage lower than the first voltage to the gate of the second selection gate transistor, and
   the bit line control circuit supplies the first voltage to the bit line which is not selected for writing, and the source line drive circuit supplies the first voltage to the source line.

2. The non-volatile semiconductor memory device according to claim 1, wherein the selection gate drive circuit supplies a minute potential which alleviates an electric field between one end of a current path of the second selection gate transistor and the gate of the second selection gate transistor to suppress occurrence of hot carriers to the gate of the second selection gate transistor.

3. The non-volatile semiconductor memory device according to claim 1, further comprising:
   a row selection circuit which selects the control gates of the memory cells and the gates of the first and second selection gate transistors based on an address signal; and
   a column selection circuit which selects the bit line based on the address signal.

4. The non-volatile semiconductor memory device according to claim 3, further comprising:
   an address buffer which stores the address signal which is externally input, and outputs the address signal to the row selection circuit and the column selection circuit; and
   a data input/output buffer which stores write data which is externally input, and outputs this data to the bit line control circuit.

5. The non-volatile semiconductor memory device according to claim 1, wherein the memory cell group has an NAND type structure in which the memory cells are connected in series in such a manner that a source or a drain is shared by the memory cells adjacent to each other.

6. The non-volatile semiconductor memory device according to claim 5, wherein the non-volatile semiconductor memory device includes an electrically rewritable NAND type electrically erasable and programmable ROM.

7. A non-volatile semiconductor memory device comprising:
   a memory cell group in which a plurality of memory cells each having a control gate and a floating gate are connected in series;
   a first selection gate transistor connected between one end of the memory cell group and a bit line;
   a second selection gate transistor which is connected between the other end of the memory cell group and a source line and has a gate length shorter than a gate length of the first selection gate transistor;
   a control gate drive circuit which drives the control gates of the memory cell group;
   a selection gate drive circuit which drives gates of the first and second selection gate transistors;
   a source line drive circuit which drives the source line; and
   a bit line control circuit which supplies a bit line potential which is used to select data to be written in the memory cells through the bit line,
   wherein, at the time of a write operation, the control gate drive circuit applies a predetermined voltage to the control gate of the memory cell adjacent to the second selection gate transistor in the memory cell group, applies a write voltage higher than the predetermined voltage to the control gate of the memory cell as a write target, and applies an intermediate voltage higher than the predetermined voltage and lower than the write voltage to the control gates of the other memory cells, the selection gate drive circuit supplies a first voltage lower than the intermediate voltage to the gate of the first selection gate transistor, and supplies a second voltage lower than the first voltage to the gate of the second selection gate transistor, and the bit line control circuit supplies the first voltage to the bit line which is not selected for writing, and the source line drive circuit supplies the first voltage to the source line.

8. The non-volatile semiconductor memory device according to claim 7, wherein the selection gate drive circuit supplies a minute potential which alleviates an electric field between one end of a current path of the second selection gate transistor and the gate of the second selection gate transistor to suppress occurrence of hot carriers to the gate of the second selection gate transistor.

9. A non-volatile semiconductor memory device comprising:
- a memory cell group in which a plurality of memory cells each having a control gate and a floating gate are connected in series;
- a first selection gate transistor connected between one end of the memory cell group and a bit line;
- a second selection gate transistor which is connected between the other end of the memory cell group and a source line, and has a gate length shorter than a gate length of the first selection gate transistor;
- a control gate drive circuit which drives the control gates of the memory cell group;
- a selection gate drive circuit which drives gates of the first and second gate transistors;
- a source line drive circuit which drives the source line; and
- a bit line control circuit which supplies a bit line potential which is used to select data to be written in the memory cells through the bit line,
- wherein, at the time of a write operation, the control gate drive circuit applies a write voltage to the control gate of the memory cell as a write target adjacent to the second selection gate transistor in the memory cell group, and applies an intermediate voltage lower than the write voltage to the control gates of the other memory cells,
- the selection gate drive circuit supplies a first voltage lower than the intermediate voltage to the gate of the first selection gate transistor, and supplies a second voltage lower than the first voltage to the gate of the second selection gate transistor, and
- the bit line control circuit supplies the first voltage to the bit line which is not selected for writing, and the source line drive circuit supplies a predetermined voltage higher than the first voltage to the source line.

10. The non-volatile semiconductor memory device according to claim 9, wherein the selection gate drive circuit supplies a minute potential which alleviates an electric field between one end of a current path of the second selection gate transistor and the gate of the second selection gate transistor to suppress occurrence of hot carriers to the gate of the second selection gate transistor.

11. A non-volatile semiconductor memory device comprising:
- a memory cell array in which memory cell units are arranged in a matrix form, the memory cell unit each including a memory cell group, a first selection gate transistor and a second selection gate transistor, the memory cell group including a plurality of memory cells each having a control gate and a floating gate superimposed therein are connected in series in such a manner that a source or a drain is shared by the memory cells adjacent to each other, the first selection gate transistor being connected between one end of the memory cell group and a bit line, the second selection gate transistor being connected between the other end of the memory cell group and a source line, the second selection gate transistor having a gate length shorter than a gate length of the first selection gate transistor;
- a control gate drive circuit which drives the control gates of the memory cell groups in the memory cell unit;
- a selection gate drive circuit which drives gates of the first and second gate transistors in the memory cell unit;
- a source line drive circuit which drives the source line; and
- a bit line control circuit which writes data in the memory cells through the bit line.

12. The non-volatile semiconductor memory device according to claim 11, wherein, at the time of a write operation, the control gate drive circuit applies a write voltage to the control gate of the memory cell as a write target in the memory cell group, and applies an intermediate voltage lower than the write voltage to the control gates of the other memory cells,
- the selection gate drive circuit supplies a power supply voltage lower than the intermediate voltage to the gate of the first selection gate transistor, and supplies a reference voltage lower than the power supply voltage to the gate of the second selection gate transistor, and
- the bit line control circuit supplies the power supply voltage to the bit line, and the source line drive circuit supplies the power supply voltage to the source line.

13. The non-volatile semiconductor memory device according to claim 11, wherein, at the time of a write operation, the control gate drive circuit applies a predetermined voltage to the control gate of the memory cell adjacent to the second selection gate transistor in the memory cell group, applies a write voltage higher than the predetermined voltage to the control gate of the memory cell as a write target, and applies an intermediate voltage higher than the predetermined voltage and lower than the write voltage to the control gates of the other memory cells,
- the selection gate drive circuit supplies a power supply voltage lower than the intermediate voltage to the gate of the first selection gate transistor, and supplies a reference voltage lower than the power supply voltage to the gate of the second selection gate transistor, and
- the bit line control circuit supplies the power supply voltage to the bit line, and the source line drive circuit supplies the power supply voltage to the source line.

14. The non-volatile semiconductor memory device according to claim 11, wherein, at the time of a write operation, the control gate drive circuit applies a write voltage to the control gate of the memory cell as a write target adjacent to the second selection gate transistor in the memory cell group, and applies an intermediate voltage lower than the write voltage to the control gates of the other memory cells,
- the selection gate drive circuit supplies a power supply voltage lower than the intermediate voltage to the gate of the first selection gate transistor, and supplies a reference voltage lower than the power supply voltage to the gate of the second selection gate transistor, and
- the bit line control circuit supplies the power supply voltage to the bit line, and the source line drive circuit supplies a predetermined voltage higher than the power supply voltage.

15. The non-volatile semiconductor memory device according to claim 11, further comprising:
- a row selection circuit which selects the control gates of the memory cells and the gates of the first and second selection gate transistors based on an address signal; and
- a column selection circuit which selects the bit line based on the address signal.

16. The non-volatile semiconductor memory device according to claim 15, wherein the memory cell array includes a plurality of blocks, each of the blocks includes a plurality of pages, and each of the pages includes the plurality of memory cells which share the control gate.

17. The non-volatile semiconductor memory device according to claim 16, wherein the row selection circuit selects the blocks and the pages based on the address signal.

18. The non-volatile semiconductor memory device according to claim 15, further comprising:
- an address buffer which stores the address signal which is externally input, and outputs the address signal to the row selection circuit and the column selection circuit; and
- a data input/output buffer which stores externally input write data, and outputs the write data to the bit line control circuit.

19. The non-volatile semiconductor memory device according to claim 11, wherein the non-volatile semiconductor memory device includes an electrically rewritable NAND type electrically erasable and programmable ROM.

* * * * *